United States Patent
Ehben

(10) Patent No.: US 6,433,592 B1
(45) Date of Patent: Aug. 13, 2002

(54) METHOD AND APPARATUS FOR SWITCHING A FIELD-EFFECT TRANSISTOR

(75) Inventor: Thomas Ehben, Munich (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/674,823
(22) PCT Filed: May 3, 1999
(86) PCT No.: PCT/DE99/01306

§ 371 (c)(1),
(2), (4) Date: Nov. 6, 2000

(87) PCT Pub. No.: WO99/59249

PCT Pub. Date: Nov. 18, 1999

(30) Foreign Application Priority Data

May 12, 1998 (DE) .......................................... 198 21 232

(51) Int. Cl.$^7$ ................................................ H03B 1/00
(52) U.S. Cl. ...................... 327/108; 327/376; 327/170; 326/33; 326/83
(58) Field of Search ................................ 327/108, 112, 327/170, 308, 374, 376, 379, 384, 387; 326/17, 31, 33, 34, 83, 87

(56) References Cited

U.S. PATENT DOCUMENTS

| 5,041,741 A | * | 8/1991 | Steele | 326/33 |
| 5,120,992 A | | 6/1992 | Miller et al. | 326/82 |
| 5,317,206 A | | 5/1994 | Hanibuchi et al. | 327/108 |
| 5,461,265 A | * | 10/1995 | Kunihisa et al. | 327/379 |
| 5,546,029 A | | 8/1996 | Koke | 327/108 |
| 5,633,600 A | * | 5/1997 | Ohnishi | 326/17 |
| 5,694,065 A | * | 12/1997 | Hamasaki et al. | 327/108 |

FOREIGN PATENT DOCUMENTS

| DE | 38 53 666 | 10/1995 |
| EP | 0 513 663 | 11/1992 |
| EP | 0 587 999 | 3/1994 |

OTHER PUBLICATIONS

Patent Abstracts of Japan: JP 05 083 100 dated Apr. 02, 1993.

* cited by examiner

Primary Examiner—Terry D. Cunningham
Assistant Examiner—Long Nguyen
(74) Attorney, Agent, or Firm—Schiff Hardin & Waite

(57) ABSTRACT

A method and apparatus in which the switching of a field-effect transistor is effected by the application of a control voltage suitable for switching to an RC element connected upstream of the gate terminal. The method and apparatus are distinguished by the fact that switching of the field-effect transistor is carried out using a control voltage that at least temporarily only slightly exceeds the threshold voltage via an attenuation circuit which has to be applied to the gate terminal of the field-effect transistor in order to be able to effect switching of the transistor.

6 Claims, 2 Drawing Sheets

METHOD AND APPARATUS FOR SWITCHING A FIELD-EFFECT TRANSISTOR

BACKGROUND OF THE INVENTION

The present invention relates to a method and an apparatus for switching a field-effect transistor from an "off" to an "on" state, or vice versa, the switching being effected by the application of a control voltage suitable for the switching to an RC element connected upstream of the gate terminal of the field-effect transistor.

Methods and devices of this type are used, in particular, in large driver stages (for example in output drivers) in integrated CMOS circuits, in order to prevent an abrupt changeover or switching of field-effect transistors that switch large amounts of power and to prevent the associated disadvantages such as, the occurrence of supply voltage fluctuations and electromagnetic interference, in particular.

A field-effect transistor with an RC element connected upstream of the gate terminal is illustrated in FIG. 3. In this case, the field-effect transistor is designated by the reference symbol T, the gate terminal of the field-effect transistor T is designated by the reference symbol G, the resistor of the RC element is designated by the reference symbol R, the capacitor of the RC element is designated by the reference symbol C, and the terminal via which the control voltage which controls the field-effect transistor T is applied to the gate terminal G thereof is designated by the reference symbol CTL.

The effect of the field-effect transistor being driven by an RC element connected upstream of its gate terminal is that the voltage at the gate terminal of the field-effect transistor changes relatively slow and does not change abruptly, which means that the field-effect transistor also changes states relatively slowly.

However, providing RC elements is relatively complicated, since RC elements having large time constants, in particular, occupy a relatively large area on the integrated circuit, which understandably constitutes a considerable disadvantage.

SUMMARY OF THE INVENTION

The present invention is based on an object, therefore, of providing a method and apparatus such that an abrupt changeover of the field-effect transistor can be reliably prevented with minimal technical outlay.

This and other objects are achieved according to the present invention by a method for switching a field-effect transistor from one state to another state including inputting a control signal having a first voltage level from a control input to a gate terminal of the field-effect transistor via an attenuating circuit and an RC element. The attenuating circuit and RC element are connected between the gate terminal of the field-effect transistor and the control input and are configured to apply control voltage for switching the field-effect transistor. Next, the field-effect transistor switch by at least temporarily attenuating the control voltage via the attenuating circuit to a second voltage level that is applied to the gate terminal via the RC element. The second voltage level is set to slightly exceed a threshold switching voltage of the field-effect transistor by a small amount and also being significantly less than the first voltage level.

According to another aspect of the present invention, an apparatus for switching the field-effect transistor is provided to switch the transistor from one state to another. The apparatus includes a control input to receive a control signal having a predetermined voltage level. An attenuation circuit is connected to a control input for receiving and attenuating the predetermined voltage level and, in turn, outputting a control voltage. Connected between the output of the attenuation circuit and gate terminal the field-effect transistor is an RC element for delivering the control voltage to the gate terminal with a predetermined time delay to switch the field-effect transistor. The control voltage is at least temporarily set by the attenuation circuit to an attenuated voltage level that slightly exceeds the threshold switching voltage of the field-effect transistor by a small amount and is significantly less than the predetermined voltage level.

Accordingly, the changeover of the field-effect transistor is carried out using a control voltage which at least temporarily only slightly exceeds the threshold voltage and has to be applied to the gate terminal of the field-effect transistor in order to be able to effect changeover thereof.

The effect that can be achieved by the present invention is that the voltage established at the gate terminal of the field-effect transistor changes particularly slowly in the region of the threshold voltage, even when the RC element used has only a relatively small time constant. This is because the voltage established at the gate terminal of the field-effect transistor is also the voltage established across the capacitor of the RC element connected upstream, and this voltage follows changes in the control voltage only gradually and becomes approximately the same voltage particularly slowly in the final stage.

As a result, an abrupt changeover of the field-effect transistor can be reliably prevented in a surprisingly simple manner and with minimal technical outlay.

Additional advantages and novel features of the invention will be set forth, in part, in the description that follows and, in part, will become apparent to those skilled in the art upon examination of the following or may be learned by practice of the invention. The advantages of the invention may be realized and attained by means of the instrumentalities and combination particularly pointed out in the appended claims.

BRIEF DESCRIPTION OF THE DRAWINGS

The invention is explained in more detail below using an exemplary embodiment with reference to the drawings wherein.

DETAILED DESCRIPTION OF THE PREFERRED EMBODIMENTS

In the present invention, the field-effect transistor whose switching behavior is to be influenced is part of an integrated circuit. However, the transistor may also be realized as a discrete component. The same applies to the corresponding attenuation circuit used to influence the switching behavior of the field-effect transistor.

According to the present invention the integrated circuit of which the field-effect transistor and the attenuation circuit are a part is a CMOS circuit. However, the circuit could also be purely an NMOS or PMOS circuit or another integrated circuit.

Figure 1:
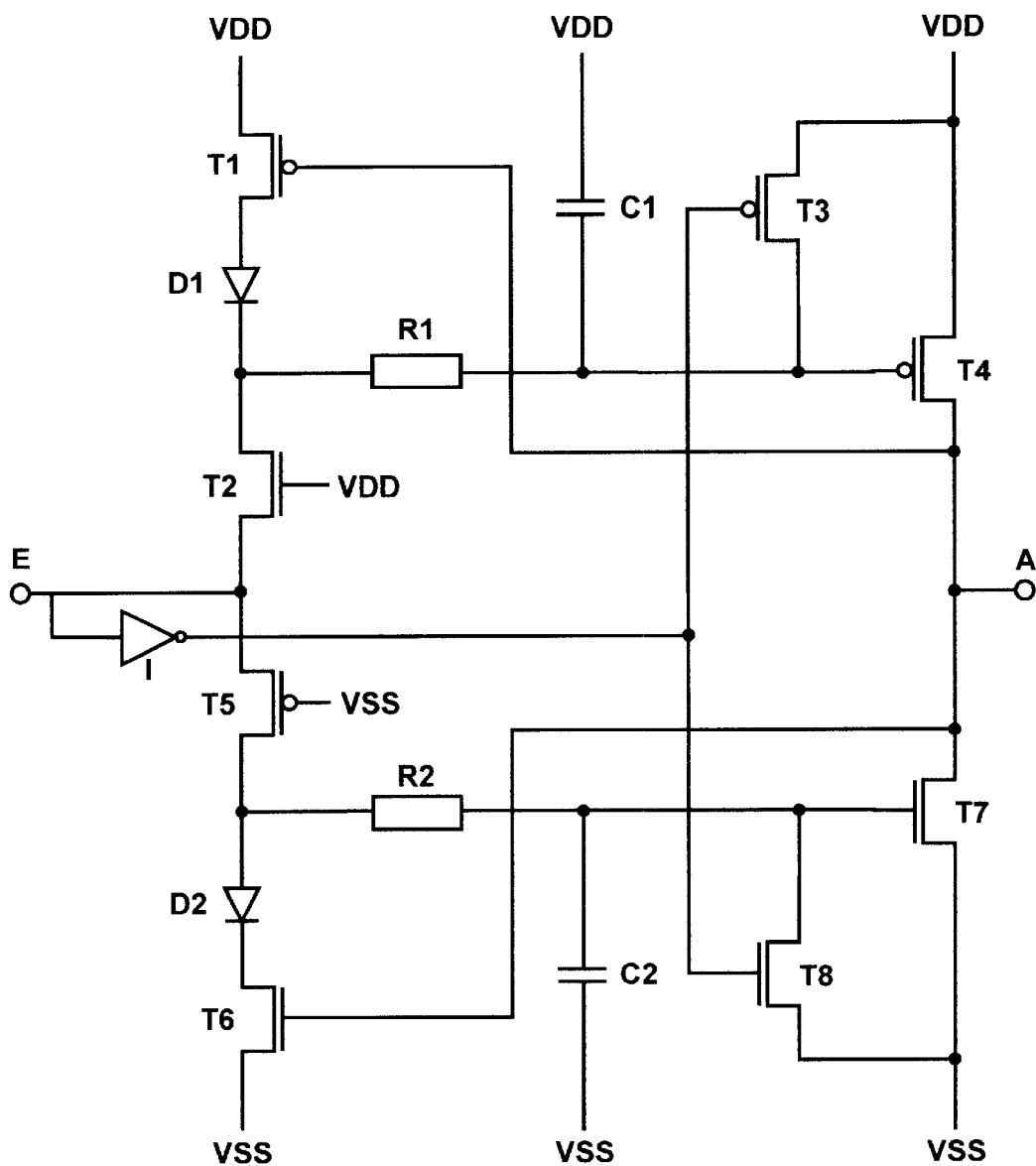
FIG. 1 illustrates a driver stage with an exemplary embodiment of an attenuation circuit designed for driving a field-effect transistor according to the present invention.

The field-effect transistor whose switching behavior is intended to be influenced and the attenuation circuit that is intended to be used to effect this are part of the driver circuit shown in FIG. 1.

The driver circuit comprises PMOS transistors T1, T3, T4 and T5, NMOS transistors T2, T6, T7 and T8, diodes D1 and D2, resistors R1 and R2, capacitors C1 and C2, and an inverter I, which are connected as shown in FIG. 1. The capacitors C1 and C2 need not necessarily be separate components; the parasitic capacitances of the transistors T4 and T7 may be involved in this case.

A supply voltage whose poles are at the potentials VSS and VDD is applied to the driver circuit, where VSS has the lower potential of 0 V, for example, and VDD has the higher potential of 5 V, for example.

The driver circuit has an input terminal E and an output terminal A, where an output signal having a low level is output from the output terminal A when the input signal input into the input terminal E has a high level, and where the output signal with a high level is output from the output terminal A when the input signal input into the input terminal E has a low level. In this case, the low level shall be represented by the low supply voltage potential VSS, and the high level by the high supply voltage potential VDD.

The output signal output from the output terminal A is generated by the transistors T4 and T7, the transistor T4 designed to switch VDD through VDD to the output terminal A, and the transistor T7 designed to switch VSS through to the output terminal A. Transistors T3 and T8 ensure that transistors T4 and T7 are never turned on simultaneously.

Attenuation circuits are connected upstream of the gate terminals of the transistors T4 and T7, with an attenuation circuit assigned to transistor T4 comprising transistors T1 and T2, diode D1, resistor R1 and capacitor C1, and an attenuation circuit assigned to transistor T7 comprising transistors T5 and T6, diode D2, resistor R2 and capacitor C2.

The attenuation circuit connected upstream of transistor T4 and the attenuation circuit connected upstream of transistor T7 are constructed symmetrically (i.e., the same construction). Accordingly only one (the attenuation circuit connected upstream of the transistor T7) will be described below; the both attenuation circuit.

The attenuation circuit assigned to transistor T7 is composed of an RC element connected upstream of the gate terminal of transistor T7 and a voltage divider connected upstream of the RC element, the RC element comprising resistor R2 and the capacitor C2, and the voltage divider comprising transistors T5 and T6 and diode D2.

The transistor T7 is ultimately intended to operate in a manner dependent on the input signal input via the input terminal E. However, the input signal is not fed directly to the gate terminal of transistor T7, but rather via the attenuation circuit connected upstream of transistor 17.

This affects the voltage established at the gate terminal of transistor T7 in two respects. On the one hand, edges present in the input signal are switched through to the gate terminal of the transistor T7 only after having been attenuate due to the RC element. On the other hand, the switched-through voltage is lower than the input signal due to the voltage divider.

If the voltage divider is dimensioned a such a that it applies a voltage to the RC element that only slightly exceeds the threshold voltage, which has to be applied to the gate terminal of transistor T7 in order to effect changeover (i.e switching) then, a slow change in the voltage established at the gate terminal of the transistor T7 in the region of the threshold voltage may be achieved. This is because capacitors have the property wherein the voltage established across a capacitor changes increasingly more slowly as the voltage across the capacitor approaches the voltage used to charge it.

The effect of the change in the voltage established at the gate terminal of transistor T7, this change taking place particularly slowly in the region of the threshold voltage of transistor T7, is that transistor T7 changes over (i.e., switches states) particularly slowly, even when the RC element used has only a relatively small time constant.

In order to precisely explain the function and method of operation of the driver circuit of FIG. 1, the following description is given of the operations the ensue, after the input signal input into the input terminal E changes from the low level to the high level.

It is assumed that the input signal input into the input terminal E initially has a low level and the output signal output from the output terminal A initially has a high level. The effect of the change in the input signal from the low to the high level is that a current flows through transistor T5, which which is likewise turned on at least temporarily. Transistor T6 is turned on at least temporarily because its gate voltage (i.e., the output signal output via the output terminal A of the driver circuit) is initially still greater, at least by the threshold voltage of the transistor T6, than the voltage present at its source terminal. This is because the current flowing via transistor T5, diode D2 and transistor T6 causes a voltage drop across the diode D2, this voltage drop being approximately as large as the threshold voltage of the transistor T6. The fact that a voltage drop occurs across diode D2 that is approximately as large as the threshold voltage of transistor T6 can be achieved, for example, by the diode D2 being comprised of a MOS diode, (i.e., a field-effect transistor whose drain and gate terminals are connected to one another).

The voltage established at the anode of the diode D2 is the control voltage that controls the field-effect transistor T7, in which case, as has already been mentioned above, the control voltage is not applied directly to the gate terminal of the field-effect transistor T7, but rather to the RC element connected upstream of the gate of transistor T7.

The effect of the control voltage being applied to the RC element connected to transistor T7 is that the capacitor C2 is charged to the control voltage, the voltage established across the capacitor C2 being the voltage applied to the gate terminal of the transistor T7.

As is known, the capacitor is charged in a highly non-linear manner, the change in the voltage established across the capacitor taking place more and more slowly with increasing approach of the voltage across the capacitor to the voltage charging the capacitor. In the present example, the voltage charging the capacitor is considered the control voltage reduced by the voltage divider and is designated below as Vr.

Figure 2:
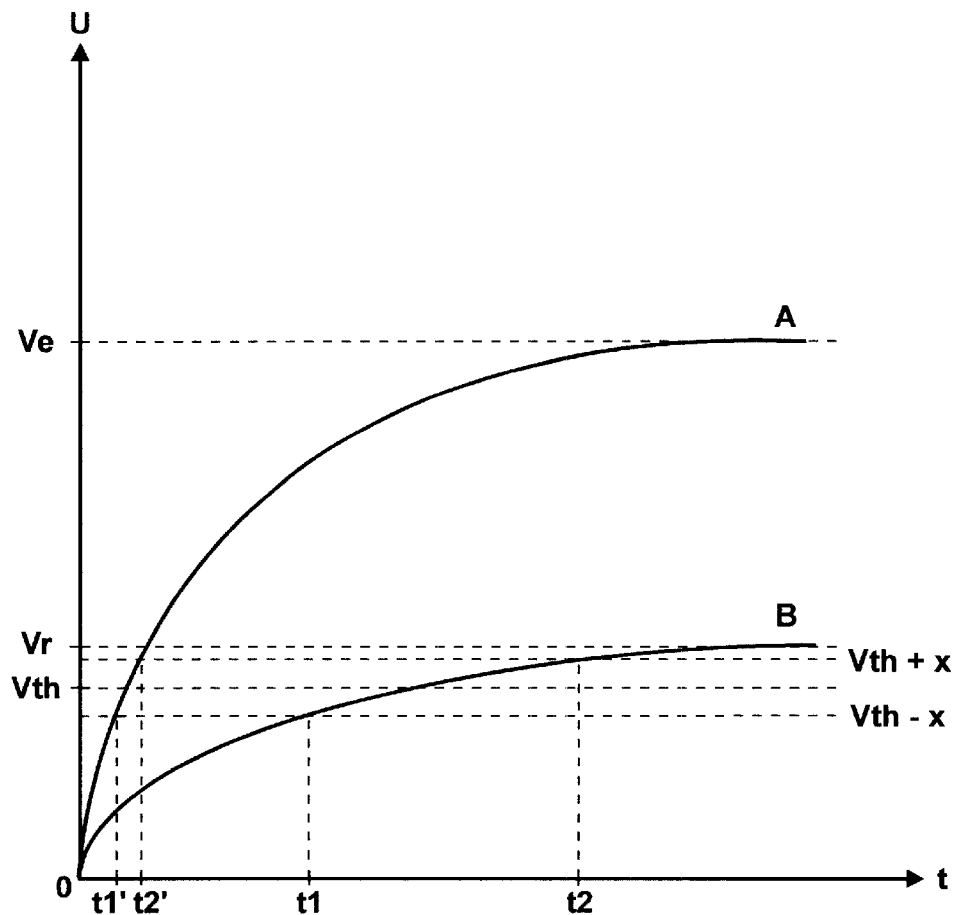
FIG. 2 shows the profile of the voltage established at the gate terminal of the field-effect transistor for different scenarious of driving the transistor.
Figure 3:
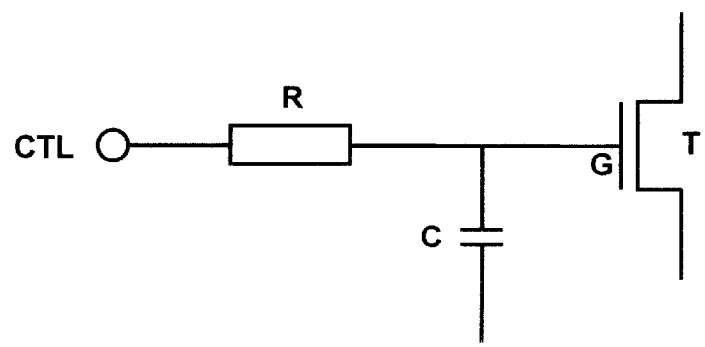
FIG. 3 shows a field-effect transistor with an RC element connected upstream of the gate terminal.

In the upper region of the capacitor charging curves illustrated in FIG. 2 (i.e., in the region where the curve has the smallest gradient transistor T7 is turned on gradually and pulls the output voltage output from the output terminal A of the driver circuit gradually downward. Since the transistor T7 is driven slowly, the change in the output voltage likewise takes place relatively slowly. A result, the profile of the output voltage is independent of a load to the greatest possible extent and, moreover, does not cause any supply voltage fluctuations.

Even before the voltage established at the gate terminal of transistor T7 reaches the threshold voltage Vth of the transistor T7, which causes the transistor T7 to be turned on, the gate terminal of the output transistor T4, which is a complementary transistor with respect to the transistor T7, is discharged via the inverter I and the transistor T3. This prevents the transistors T4 and T7 from being turned on simultaneously.

At some point shortly before the complete changeover (i.e., switching) of the transistor T7, more precisely when the voltage at the output terminal A no longer suffices to keep the transistor T6 switched on, the transistor T6 is consequently put into the off state, thereby preventing current flow via the transistor T5, the diode D2 and the transistor T6. This is equivalent to deactivation of the voltage divider connected upstream of the RC element. The input signal input via the input terminal E is then applied directly to the RC element via the transistor T5. As a result, the voltage established across the capacitor C2 and, thus, also the voltage established at the gate terminal of transistor T7 rises to the voltage of the input signal input terminal E, designated below by Ve. As a result, the transistor T7, which is already switched on, remains reliably switched on even in the event of any interference (voltage fluctuations) that may occur.

The above described circuit is extremely stable on account of its simple structure (in particular because it is possible to dispense with a regulatory with negative feedback of the output voltage). Also, the transistors are preferably operated in operating ranges in which manufacturing tolerances have little or no effect on their behavior.

The profile of the voltage established across the capacitor C2 of the RC element, and, thus also at the gate terminal of the transistor T7 until the latter has switched on completely can be seen represented by curve B shown in FIG. 2.

As can be seen from the curve B the voltage established across the capacitor C2 and, thus, also at the gate terminal of the transistor T7 rises, starting from the instant t=0, with a decreasing gradient to the reduced control voltage Vr initially applied to the RC element, the control voltage Vr being only just above the threshold voltage (designated by Vth) of the transistor T7 in the present example. In this case, at the instant t1, the voltage across capacitor C2 reaches a voltage Vth−x somewhat below the threshold voltage Vth. At the instant t2, the voltage across capacitor C2 reaches a voltage Vth+x, which is somewhat above the threshold voltage Vth but still below the reduced control voltage Vr. The voltage Vth−x is the voltage at which the changeover (i.e., switching) of the transistor T7 begins. The voltage Vth+x is the voltage at which the changeover of the transistor T7 ends. The transistor T7 changes over (i.e. switches) between the instants t1 and t2, the period of time between t1 and t2 being relatively long and the changeover taking place slowly, accordingly.

If the signal input via the input terminal E of the driver circuit in accordance with FIG. 1 were, as previously, applied directly (to its full extent) to the RC element connected upstream of the gate terminal of the transistor T7, then the conditions shown in the curve A in FIG. 2 would occur. In other words, the voltage established across the capacitor C2 and, thus, also at the gate terminal of the transistor T7 would rise to the comparatively high voltage Ve and would reach the voltages Vth−x and Vth +x at the instants t1' and t2', respectively, the period of time between t1' and t2' being relatively short and the changeover of the transistor consequently taking place considerably faster than is the case with curve B.

Hence, an abrupt changeover of the field-effect transistor can be prevented in a simple manner and with minimal technical outlay.

While this invention has been described in connection with what is presently considered to be the most practical and preferred embodiment, it is to be understood that the invention is not limited to the disclosed embodiment, but, on the contrary, is intended to cover various modifications and equivalent arrangements include within the spirit and scope of the appended claims.

What is claimed is:

1. An apparatus for switching a field-effect transistor from one state to another state, the field-effect transistor having a threshold switching voltage at which the field-effect transistor is switched, the apparatus comprising:

a control input for receiving a control signal having a predetermined voltage level;

an attenuation circuit connected to control input for receiving and attenuating the predetermined voltage level of the control signal and outputting a control voltage; and an RC element connected between an output of the attenuation circuit and a gate terminal of the field-effect transistor for delivering the control voltage to the gate terminal with a predetermined time delay to switch the field-effect transistor;

wherein the control voltage is at least temporarily set by the attenuation circuit to an attenuated voltage level that slightly exceeds the threshold switching voltage of the field-effect transistor by a small amount and that is significantly less than the predetermined voltage level.

2. The apparatus as claimed in claim 1, wherein the attenuation circuit is comprised of a voltage divider.

3. The apparatus as claimed in claim 2, wherein the voltage divider is capable of being deactivated wherein when the voltage divider is deactivated the attenuation circuit delivers the predetermined voltage essentially unchanged to the RC element.

4. The apparatus as claimed in claim 3, wherein the voltage divider is configured to be automatically deactivated when the field-effect is at least partially switched.

5. A method for switching a field-effect transistor from one state to another state; comprising the steps of:

inputting a control signal having a first voltage level from a control input to a gate terminal of the field-effect transistor via an attenuating circuit and an RC element connected between the gate terminal and the control input, the attenuating circuit and RC element configured to apply a control voltage for switching the field-effect transistor; and switching the field-effect transistor by at least temporarily attenuating the control voltage via the attenuating circuit to a second voltage level that is applied to the gate terminal of the field-effect transistor via the RC element, the second voltage level slightly exceeding a threshold switching voltage of the field-effect transistor by a small amount and being significantly less than the first voltage level.

6. The method as claimed in claim 5, further comprising the step of:

increasing control voltage to the first voltage level after the field-effect transistor has been switched.

* * * * *